United States Patent [19]

Yarger et al.

[11] Patent Number: 4,959,504

[45] Date of Patent: Sep. 25, 1990

[54] MAGNETICALLY AND RADIO FREQUENCY SHIELDED ENCLOSURE

[75] Inventors: Eric J. Yarger, Idaho Falls, Id.; Rex D. Yarger, Brigham City, Utah; Gary D. Clegg, Idaho Falls, Id.

[73] Assignee: Magnashield Technologies, Inc., Idaho Falls, Id.

[21] Appl. No.: 274,864

[22] Filed: Nov. 22, 1988

[51] Int. Cl.$^5$ .............................................. H05K 9/00
[52] U.S. Cl. .............................................. 174/35 MS
[58] Field of Search ................................. 174/35 MS

[56] References Cited

U.S. PATENT DOCUMENTS 3,790,696  2/1974  Lindgren ..................... 174/35 MS
4,755,630  7/1988  Smith et al. .................. 174/35 MS Primary Examiner—Leo P. Picard
Assistant Examiner—David A. Tone
Attorney, Agent, or Firm—K. S. Cornaby

[57] ABSTRACT

A self-contained room capable of shielding the interior environment from magnetic and radio frequency interferences, as well as other wave and vibrational disturbances, comprised of an outer enclosure and an inner enclosure, raised above an existing floor by a fiberglass dowel system. The walls of both enclosures are made of mumetel sheets, pressure sealed to protect against ambient and man-made interferences, with an underlying aluminum structural frame. All seams and penetrations are shielded against wave interferences of natural or man-made origin.

12 Claims, 6 Drawing Sheets

MAGNETICALLY AND RADIO FREQUENCY SHIELDED ENCLOSURE

BACKGROUND OF THE INVENTION

This invention relates to the use of rooms or enclosures which are shielded from magnetic and radio frequency disturbances. Shielded rooms are frequently used in the magnetic and scientific fields for analyzing or testing electromagnetic frequencies, or similar wave manifestations. Though many shielding devices have been presented in the prior art, none is currently capable of producing a completely pure internal environment free from any natural or man-made interference or disturbance, such as E waves, plain waves, H waves, eddie currents, radio frequencies, and magnetic interferences. Further, none can provide the kind of pure internal environment necessary for experimentation with or measurement of extremely low magnetic and RF fields while shielding out all natural background and man-made disturbances.

It is the objective of this invention to provide an enclosure shielded from magnetic, radio, and other ambient or man-made frequency interferences or disturbances.

It is further the objective of this invention to provide a shielded enclosure which is of simple and relatively expedient construction.

SUMMARY OF THE INVENTION

The present invention encompasses a free standing room or enclosure which is built upon, and raised above an aluminum sheet which rests on the existing floor of the building in which the room is placed. The room is generally constructed of joined sheets of any type of metal with a permeability rating equaling or exceeding 100, such as 45 Permalloy, 4750 alloy, Armco 48 Ni, Carpenter 49 alloy, Hipernik, Conpernik, Deltamax, 48 Orthonik, Hipernik V, Monimax, Sinimax, 78 Permalloy, 4-79 Permalloy, Hymu 80, Supermalloy, Mumetal, Permendur, 2V Permendur, Hiperco, Supermendur, 2-81 Moly Permalloy, and Carbonyl iron powder. Hereinafter, such metal shall be described simply as mumetal.

In the preferred embodiment, the room is comprised of two rooms, one inside the other. The walls of both the outer and inner enclosures are constructed of mumetal sheets of generally square dimensions which are abutted and joined by means of mumetal strips which overlap the seams formed by the abutted sheets of mumetal. The mumetal strips are then pressure sealed by means of application of an aluminum flat bar strip, disposed upon the mumetal strip. The mumetal sheets, once joined in this fashion, are backed by an aluminum sheet, which serves as a structural frame and anchoring means for the mumetal and aluminum strips and angles. The underlying aluminum structural members are butt welded together to form members for walls or floors. Walls and floors are joined using welds or by bolting to angles welded to adjacent walls or floors. All aluminum welds throughout the construction are sealed against radio frequency interference by painting with silver-impregnated paint. The walls, ceilings, and floors of the enclosures thus formed, are joined together to produce the enclosure by application of mumetal angle and aluminum angle to the outer edges of the enclosure, and are pressure sealed by the same process used for the joining of the mumetal sheets.

The floor of both the inner and outer enclosures have apertures drilled therein to allow the passage of fiberglass dowels there through. The fiberglass dowels serve to support the inner work floor of the room, and to absorb vibrational movements. The apertures for the dowels are protected from magnetic and radio frequencies by use of wave guides attached to the room floor. The work floor of the room, in the preferred embodiment, is raised above the floor of the inner enclosure by means of the doweling system, and is thus mechanically and electrically isolated from inner and outer enclosures.

To the upper surface of the ceiling of the inner enclosure are attached "I" beams to provide strength to the ceiling when equipment is attached to the ceiling. A layer of nylon is affixed to the top of the "I" beam to provide electrical isolation between inner and outer enclosures if outer enclosure ceiling sag should occur.

The inner and outer enclosures are of dimension and construction such that a space exists between the outer enclosure and the inner enclosure. This space provides isolation of the inner space from frequency and vibrational disturbances, and facilitates the magnetic field attenuation. The space between the enclosures may vary. There is no upper limit to the amount of space required between the two enclosures.

The shielded room is constructed with penetrations for cabling and with vents for air circulation. The design of the doors of the enclosures may be of a sliding, pocket type or hinged type, or any other suitable design. All penetrations, vents, or inlets to the enclosures are protected from magnetic and radio frequency interferences.

The configuration and construction of the invention disclosed herein is detailed further in the following discussion, along with disclosure of alternative embodiments.

BRIEF DESCRIPTION OF THE DRAWINGS

The present invention is more fully defined by the accompanying drawings in which.

DETAILED DESCRIPTION OF THE PREFERRED EMBODIMENTS

Figure 1:
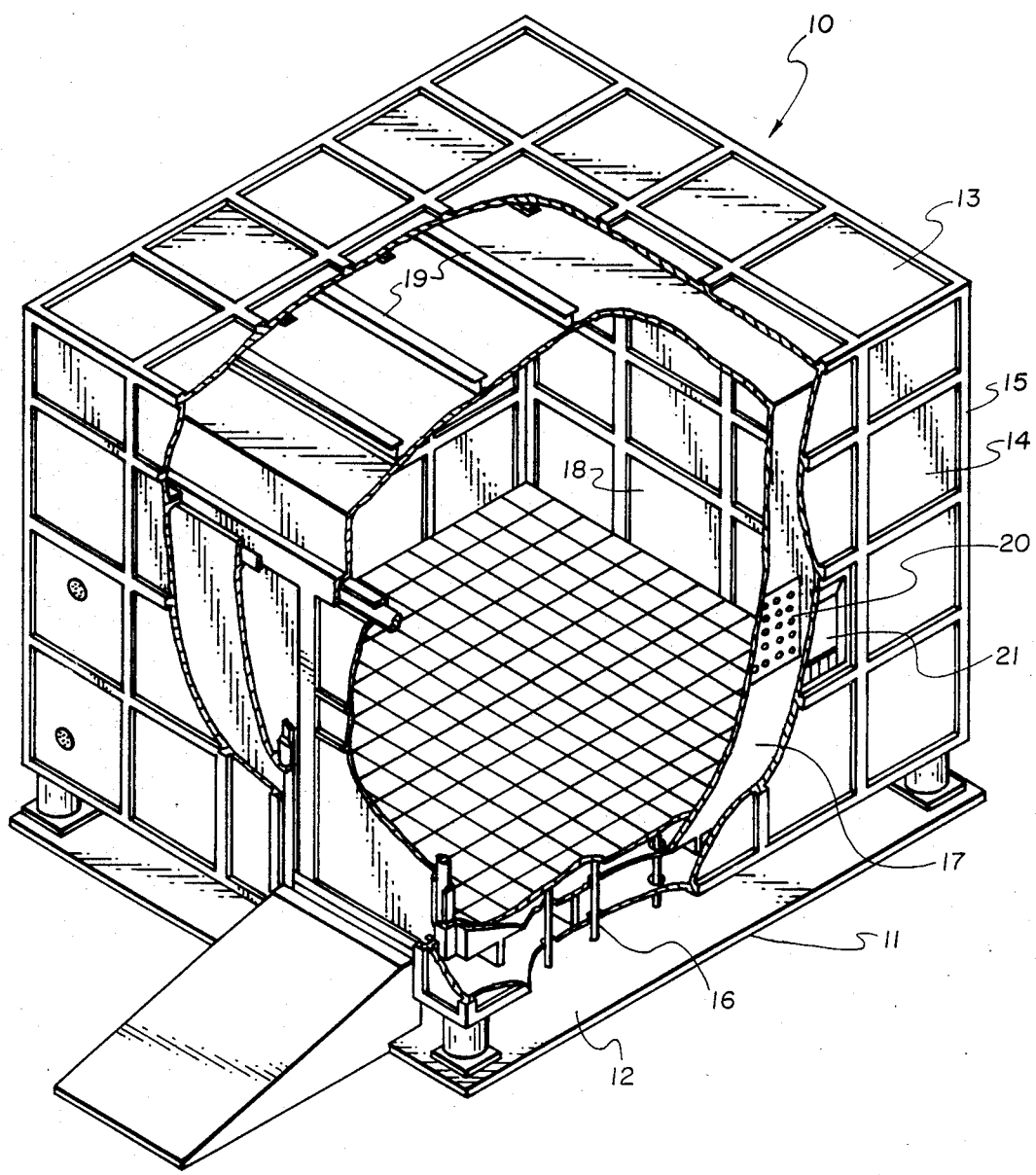
FIG. 1 is a partially cut away perspective view of the invention illustrating the inner and outer room configuration with the room raised above the existing floor.
Figure 2:
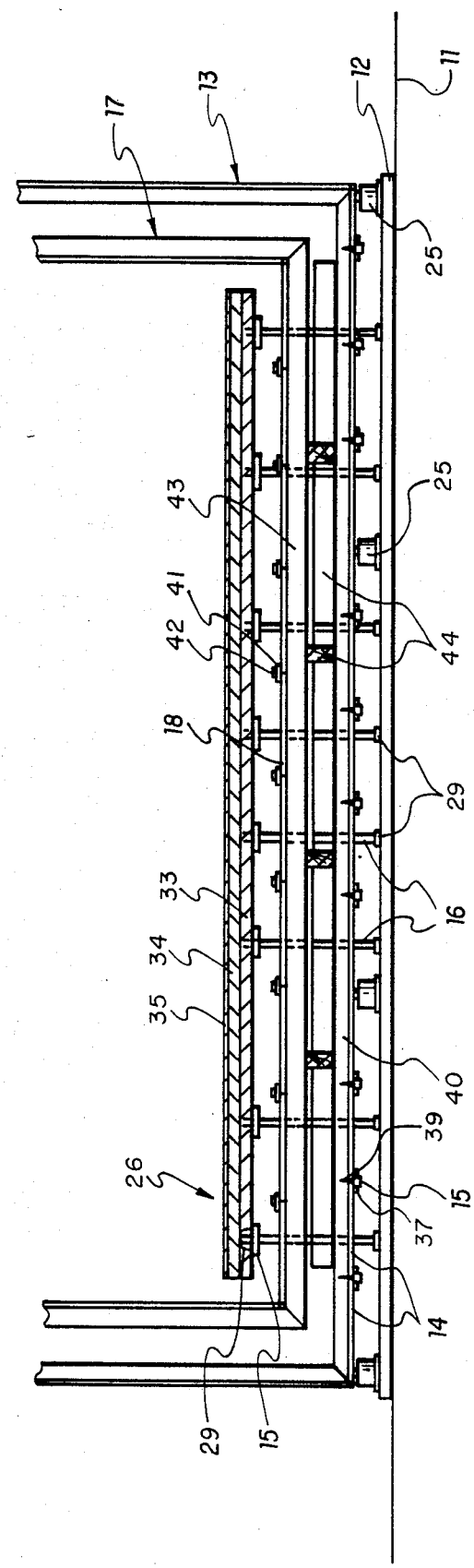
FIG. 2 is a cross-sectional view of the lower portion of the room, indicating the raised construction of the room.

The general configuration of the invention is illustrated in FIG. 1 in which the room, generally at 10, is raised above the existing floor 11 of the building by means which will be more fully elucidated in FIG. 2. The room rests upon and is suspended above a sheet of aluminum 12 which sits upon the existing floor 11. The room is generally constructed of an outer enclosure 13 constructed of mumetal sheets, the thickness of which is determined by the amount of shielding required for the purpose of which the room is used. The mumetal sheets are each hydrogen annealed at a temperature of 2050° F.

The walls, ceiling and floor of the outer enclosure are constructed of mumetal sheets comprised of individual squares 14 the dimensions of which are dependent upon the ultimate size of room desired and size of available stock materials. The individual sheets are punched and drilled prior to annealing and installation to provide optimum shielding without disturbing the annealing process. The sheets of mumetal are butted one against another to provide a minimum of space between, and are attached to one another by application of mumetal strips which overlap both edges of the abutted sheets. The mumetal strips are then covered by aluminum flat bar 15 and all thicknesses are clamped in place by use of self-tapping stainless steel screws. It should be noted that the sheets which comprise the floor of the outer enclosure have holes drilled through them to receive the doweling 16 as more fully described in FIG. 2.

A wood lattice rests upon the floor of the outer enclosure, against the aluminum sheet, supporting the inner enclosure, and provides a buffer between the inner and outer enclosures from electrical contact. Upon the wooden lattice is placed strips of nylon which are attached to the wooden lattice by brass wood screws. The nylon strips provide further electrical isolation, as well as provide ease of construction of the outer enclosure.

The structural frame of the outer enclosure may be made of any non-ferris metal material, but in order to reduce or alleviate eddie currents, the frame must be constructed of a conductive material such as copper or aluminum. Aluminum is used in the preferred embodiment and provides protection from not only eddie currents but from E waves, H waves, plain waves, Johnson effect and radio frequencies as well. In addition to providing structural support, the aluminum sheets serve as the means for clamping the joints of the mumetal and aluminum strips and angles. The aluminum sheets are butt welded together to provide a continuous eddie current shield, as well as to shield from the above-mentioned waves.

The inner room 17 is constructed in the reverse order as described for the outer enclosure in terms of materials such that the characteristic square arrangement 18 is visible within the room. In other words, to the aluminum sheets are attached the mumetal sheets, followed by placement and affixing of the mumetal and aluminum strips. This reverse construction is followed in order to provide maximum spacing for the mumetal sheets, but spacing there between can range from ¼ inch to 96 inches. The spacing of the mumetal provides for a double shield in the magnetic frequency range.

"I" beams 19 are welded to the outer surface of the ceiling of the inner enclosure, and provide maximum strength to the ceilings of the inner and outer enclosures when equipment is attached thereto.

One or more large cable throughways 20 are constructed in the walls of the inner and outer enclosures, the design of which allows cables to be fed through a square mumetal lattice at the base of the cable penetration. The cables are then fed into a copper RFI-shielded plate which allows for cable penetration without radio frequency interference penetration. The cables are connected to the RFI panel, then a raised mumetal hood 21 is secured to the panel mumetal by means of the same clamping procedure described above for connection of the mumetal sheets. Finally, a copper grounding strap (not shown) connects the two enclosures at one common point. This provides maximum shielding from all types of interferences.

In FIG. 2, a cross-sectional view of the room, it can be seen that the entire structure rests upon an aluminum sheet 12 which is placed directly on the floor 11 of the existing building. The outer enclosure 13 of the room is raised above the aluminum sheet 12 by means of pneumatic air isolators 25, made of rubber or rubber-like material, which are equally spaced around the bottom of the outer enclosure. The pneumatic isolators reduce vibrational noise and decrease harmonic distortion. They also provide a buffer against vibration from earthquakes.

The work floor of the room, generally at 26, is raised above the floor of the inner enclosure 17 and floor of the outer enclosure 13 by means of a plurality of fiberglass dowel supports 16. The fiberglass dowels, approximately ⅞ inch in diameter, are used to reduce vibrational noise and to electrically and mechanically isolate the work floor 26 from the inner enclosure 17 and outer enclosure 13. Each fiberglass dowel, at its lower end, rests within an sch40 aluminum pipe stub 29 approximately one inch high, each stub having been welded to the aluminum floor sheet 12. Each dowel passes through holes drilled in the floor of the outer enclosure and through holes drilled in the floor of the inner enclosure. The upper end of each dowel passes through a hole drilled through a ¼ inch thick strip of aluminum flat bar 15 which runs the length of the room work floor and is attached to the underside of the floor. The uppermost end of each dowel is embedded into a one inch pipe stub 29 with a cap, which is itself embedded in the underside of the room floor. Each pipe stub 29 is welded to the aluminum flat bar 15.

The floor of the room, generally at 26, is raised approximately two inches above the mumetal 18 of the inner enclosure to protect the latter. The floor of the room is comprised of a one ¾ inch thick sheet of plywood 33, attached to another ¾ inch sheet of plywood 34, the two sheets being joined by construction glue and brass wood screws. The second sheet of plywood 34 provides added structural strength to the work floor. Atop the upper sheet of plywood 34 is affixed an adhesive-type tile flooring 35 to protect the wood.

From the view in FIG. 2 the configuration of the mumetal sheets, aluminum structural frame, and sealing means is further illustrated. The mumetal sheets 14 are butted one against the other, and the seam produced thereby is sealed by a three inch wide strip of mumetal 37 laid on, and straddling the butted joint of mumetal sheets 14. To the mumetal strip is then applied a pressure seal of aluminum flat bar 15 ¼ inch thick and two inches wide. It should be noted that aluminum flat bar covers all flat joints of the entire room construction. The aluminum flat bar 15 is attached to the mumetal strip by means of countersunk 316 series stainless self-tapping screws 39. The screws also enter into a aluminum sheet 12 of the structural frame. With respect to the inner enclosure 17, the mumetal sheets 18 can also be seen to be abutted and sealed by means of mumetal strips 37 and aluminum flat bar 15, with the mumetal sheets being attached to the aluminum structural frame 43. Again it should be noted that the order of construction, in terms of materials, is reversed in the inner enclosure relative to the outer enclosure, as described above.

Upon the upper surface of the floor of the outer enclosure is a crossed network of wooden beams 44 which provides a support upon which the inner enclosure rests upon the outer enclosure.

Figure 3:
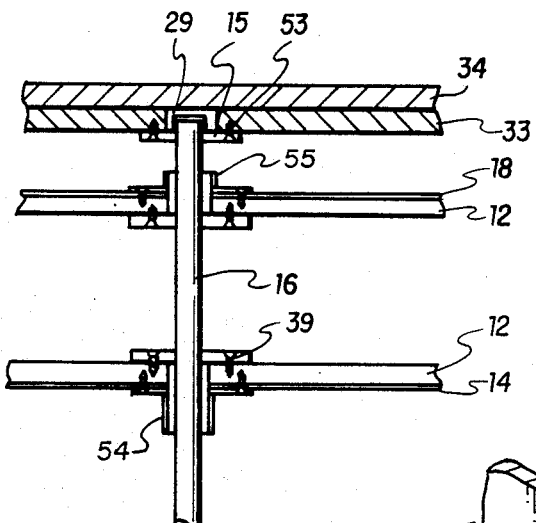
FIG. 3 is a cross-sectional view of a fiberglass dowel illustrating the means for frequency protection.

FIG. 3 is a cross-sectional close-up view of a fiberglass dowel 16 shown passing through the mumetal sheets 14 and aluminum sheet 12 of the outer enclosure and the aluminum sheet 12 and mumetal sheets 14 of the inner enclosure. The upper end of the dowel passes through the aluminum flat bar 15 and is embedded into a pipe stub 29 which is embedded into the underside layer of plywood 33 which comprises the floor of the room. The aluminum flat bar is attached to the plywood by means of brass wood screws 53. The penetrations for the dowels are both magnetically and RF protected via the magnetic wave guide 54 and the RF wave guide 55. Each fiberglass dowel also may have an RF wave guide built into it. This wave guide is constructed of ¼ inch 20 tpi copper allthread rod which has been screwed into the fiberglass dowel. A 174 inch mesh copper screen is silver soldered to the copper allthread and the entirety is attached to the aluminum sheet 12 by means of 10/32 self-tapping stainless steel screws 39. The use of the screen provides a flexibility such that the outer enclosure can move without the inner enclosure moving. This feature also prevents the residual stress risers from moving in the annealed mumetal sheets. Notably, the hydrogen atmosphere in which the mumetal is annealed makes the annealing bond very brittle, and damage may occur through any stress or shock to the mumetal sheets.

Figure 4:
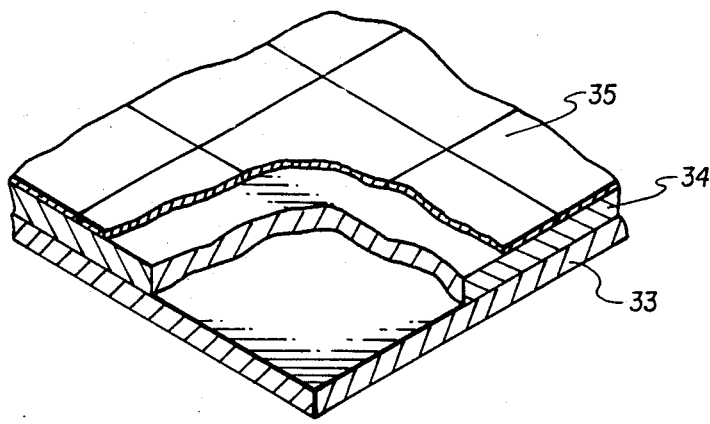
FIG. 4 is a partially cut away perspective view of the construction of the work floor within the room.

The floor of the room is illustrated in FIG. 4 in which two layers of plywood 33 and 34 are joined by brass wood screws and construction glue, and a floor of vinyl or other suitable self-adhesive tiling 35 is placed over the top layer 34 of plywood for protection.

Figure 5:
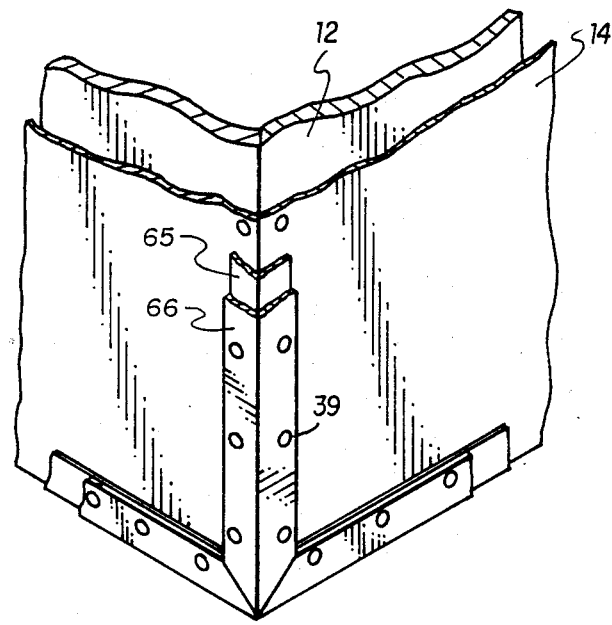
FIG. 5 is a partially cut away perspective view of one corner of the room illustrating method of construction and sealing.

The joining and sealing of the corners of the outer enclosures is illustrated in FIG. 5 in which mumetal sheets 14 are abutted at a 90 degree angle. The aluminum structural sheet 12 is seen to underlay the mumetal sheets. The seam of the corner sheets is covered by a 1½ inch mumetal angle strip 65 bent at 90° to which is applied a 1¼ inch aluminum angle 66 bent at 90° and the entirety is joined by the screws 39 described above with respect to all other joints. (Joined corners are cut at 45°) This means of joining the corners prevents the formation of any gaps through which magnetic lines of flux might pass.

Figure 6:
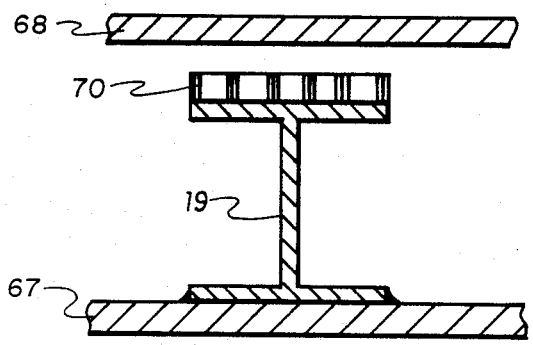
FIG. 6 is a cross-sectional view of the inner and outer rooms illustrating the insertion of "I" beam supports.

FIG. 6 illustrates the placement of the "I" beams 19 to the upper surface of the ceiling of the inner enclosure 67 to provide structural support to the roof of the inner enclosure when equipment is attached to the ceiling. The "I" beams are welded to the surface of the inner enclosure. Along the length of the upper face of the "I" beam is placed a nylon insulating strip 70 to protect and isolate the inner surface of the roof of the outer enclosure 68 from the inner enclosure.

Figure 7:
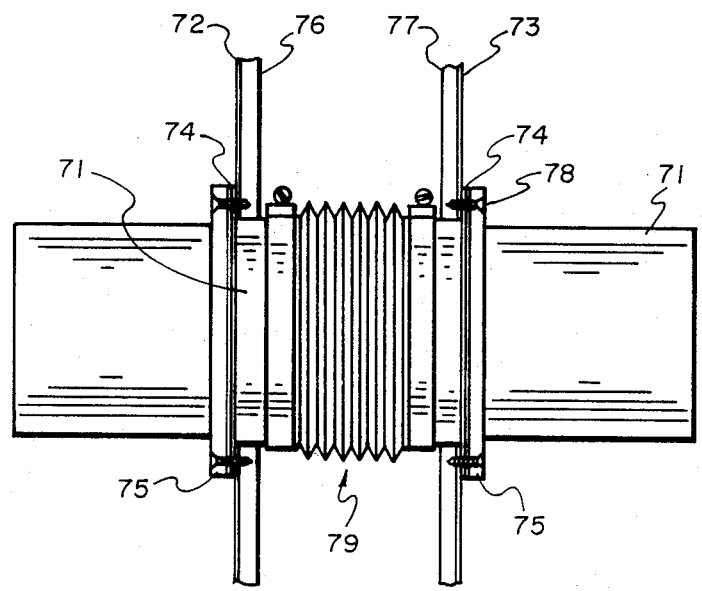
FIG. 7 is a cross-sectional view of the room ventilation port illustrating connection methods of the invention.

FIG. 7 illustrates the enclosure air vent system. The vent system consists of two identical wave guide systems 71 mounted on the outside mumetal sheet 72 of the outer enclosure, and the inside mumetal sheet 73 of the inside enclosure. These assemblies consist of two tubes 71 fabricated from mumetal, and welded to alternate sides of a perforated mumetal sheet 74. Perforations in the mumetal sheet are ¼ with ⅛ spacing all around. An aluminum collar 75 is fabricated to fit around the mumetal tube. The assembly is mounted to the wall of either enclosure by drilling a hole through the mumetal sheets 72, 73 and aluminum sheets 76, 77 of the wall, and passing the short end of the tube through the wall. The aluminum collar 75 is passed over the tube and clamps the mumetal perforated sheet 74 to the mumetal 72, 73 and aluminum 76, 77 sheets of the wall using 10–32 stainless steel self-tapping screws 78. Prior to inserting the alternate vent assembly, a flexible all plastic spiral wound hose 79 is attached to the inside tube 71 of each assembly. Then the remaining assembly is screwed to the remaining wall as described above. Following the above steps an RF filter mesh is installed inside the exposed portion of each mumetal assembly (not shown).

Figure 8:
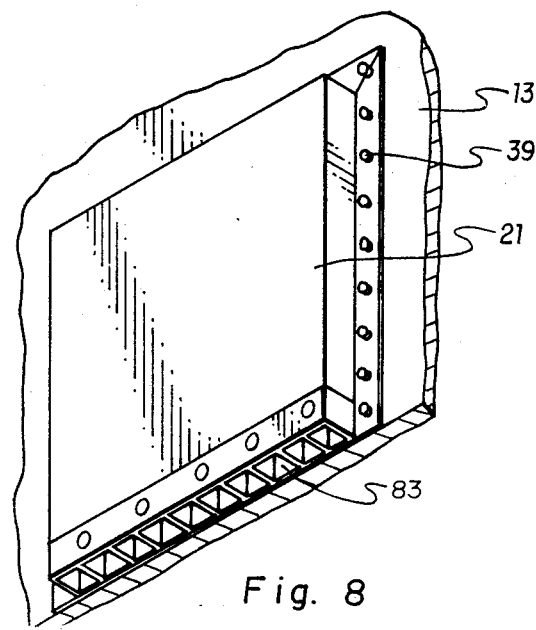
FIG. 8 is a perspective view of the internal/external cable port cover.

The outer hood of the cable feed-through port is illustrated in FIG. 8 in which the hood 21 is attached to the outer wall 13 of the outer enclosure by means of screws 39. The magnetic, shielding lattice 83 for ingress and egress of cable is disposed downwardly.

Figure 9:
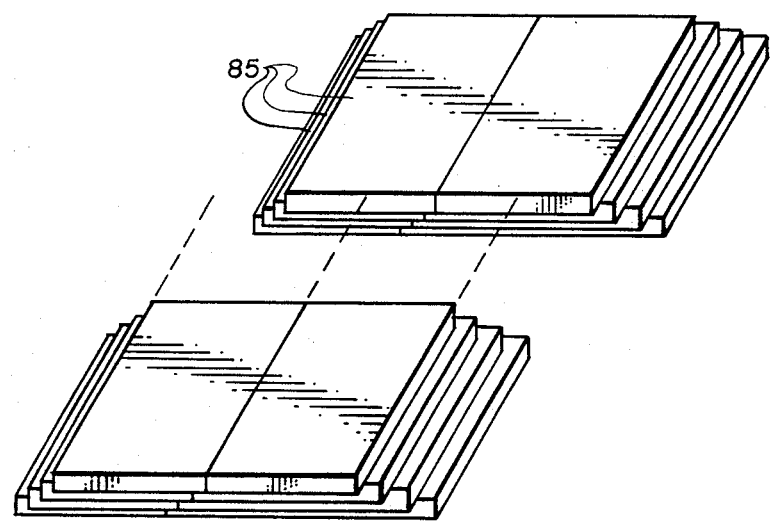
FIG. 9 is a perspective view of an alternate embodiment of the wall construction illustrating the overlapped, stepped, and fitted layers of laminated sheets.

As an alternative to the single layer mumetal sheets used in construction of the walls of the enclosures, as described above, the sheets may be comprised of multiple layers of laminated mumetal, as shown in FIG. 9. The laminated layers of metal 85 are bonded together by means of glue or other suitable bonding agent, preferably one which is highly permeable. The layers, arranged in overlapping and interlocking configuration, are then joined together by use of stainless steel rivets, screws, or any other austinetic fastener. The staggered or overlapping arrangement of the layers provides the required shielding protection without need for clamping. The number of layers required is dictated by the amount of shielding needed, and any of the metals of suitable permeability listed above may be utilized. RF shielding may or may not be used with this embodiment. When construction of the walls makes use of this embodiment, the penetrations and vents may be described above for the preferred embodiment using appropriate shielding methods, or the penetrations may be of a honeycomb-type configuration. In a further embodiment of this design, the laminated sheets are not overlapping or "stepped". The bonding and joining is accomplished by the same means as described above for the overlapped design.

Figure 10:
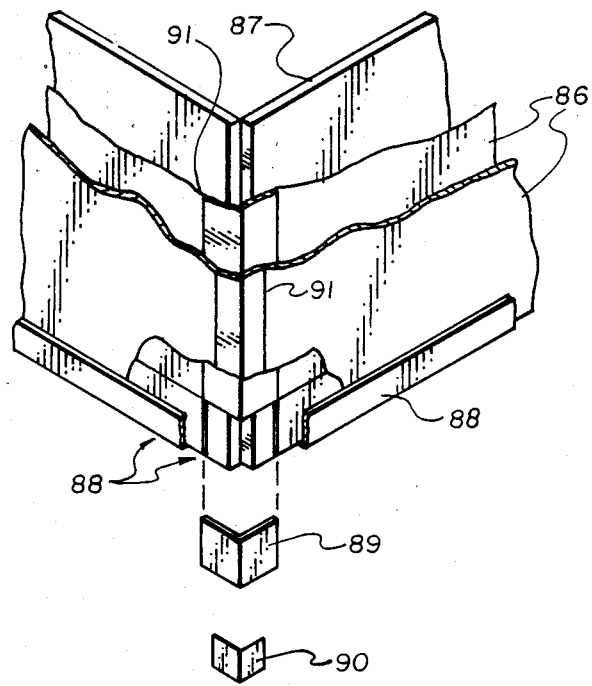
FIG. 10 is a perspective view of the corner of an alternative embodiment illustrating the layered construction and sealing of the sheets.

FIG. 10 illustrates an alternative design to that of the preferred embodiment in which multiple layers of mumetal 86 are installed on a structural support 87 without mumetal or aluminum clamping strips. The joint of any one layer is neither directly above, below, or parallel to the joint of the layer above; see generally at 88 and 91. Corner pieces are prefabricated with three sides prior to annealing. The inner corner piece 89 is of a different size than the outer corner piece 90 in order to maintain the offset joint arrangement.

Figure 11:
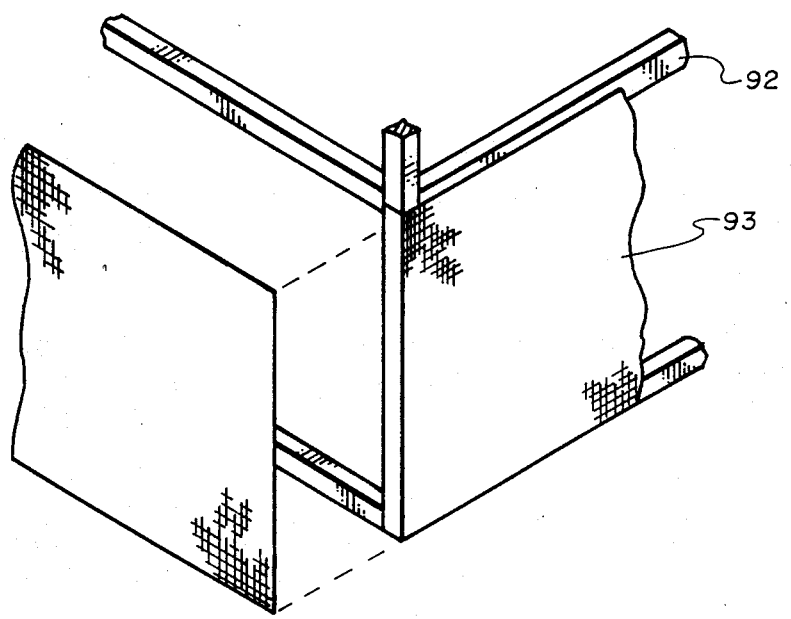
FIG. 11 is a perspective view of the corner of an alternative embodiment illustrating construction with permeable screen; and, FIG. 12 is an elevational view of the wall of an alternative embodiment illustrating a staggered joint design.

FIG. 11 illustrates another alternative for construction of the enclosures in which an aluminum frame 92 is constructed, and sheets of highly permeable mumetal screen 93 are attached thereto. The mumetal screen is coupled with RF screening (not shown). In a further alternative of this design, mumetal cloth, which is highly permeable and effective in shielding against frequency interference, is attached to the aluminum frame.

Figure 12:
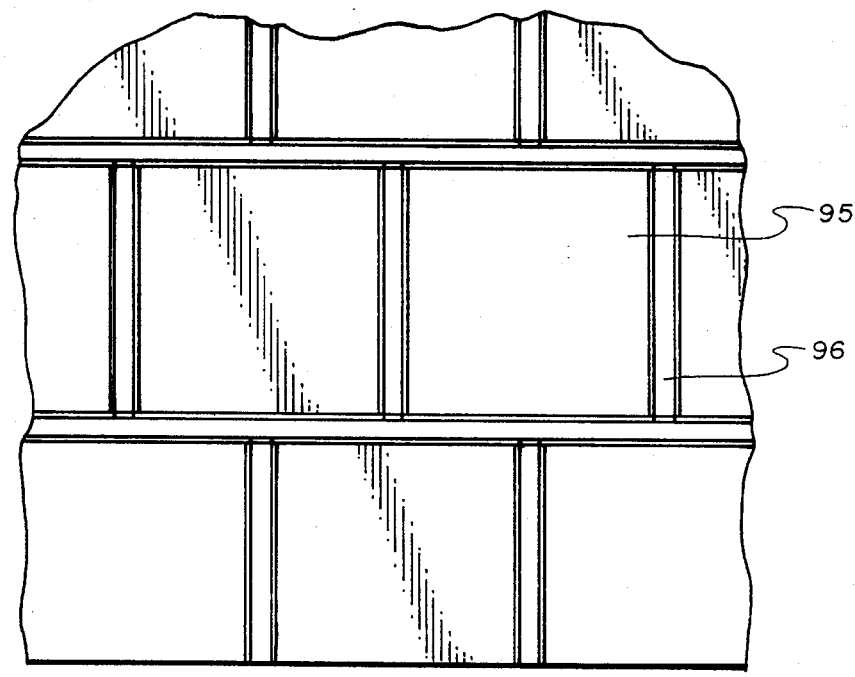

FIG. 12 is illustrative of an alternative design for joining the mumetal sheets 95 in which the sheets are joined in a staggered fashion using the same technique for sealing by use of mumetal strips and aluminum flat bar 96 as described for the preferred embodiment. The staggered arrangement provides less opportunity for the flux lines to penetrate the enclosure.

There are a number of possible alternatives for design and features in addition to those described above. For example, the mumetal sheets, joined in any of the described alternative configurations, may be beveled along each edge in order to achieve greater surface contact between mumetal sheets. The work floor of the room, rather than being mechanically and electrically isolated as in the preferred embodiment, may be mechanically and electrically joined to the inner enclosure floor or may be isolated by means of any insulating material such as foam rubber or fiberglass insulation.

Use of the pneumatic isolators supporting the outer enclosure above the aluminum sheet is optional. Further, the outer enclosure may be built directly on the existing floor of the building in which the room is placed.

Although the preferred embodiment is comprised of a series of enclosures within enclosures, the room may be constructed of a single enclosure, or more than two enclosures. The number of enclosures which may be used is limitless. The overall shape and dimension of the room may vary, and may be a square, rectangle, sphere, geodesic, or another shape.

The thickness of the materials used may be from 0.0001 inch to 20.00 inches. Substitution of suitable materials may occur in any part of the enclosure. Either annealed or unannealed metals may be used. The mumetal may be joined in any manner including the use of rivets, screws, bolts, or bonding materials. The structural frame, aluminum in the preferred embodiment, may be of any structurally sound non-ferris material, including aluminum, copper coated aluminum, aluminum angle, channel, non-ferris pipe, or wood.

An electronically developed field may be used in lieu of, or in combination with, metal shielding. This may be accomplished through the use of mylar/foil laminations, interwoven or overlapping, in a manner so as to create a magnetic field which funnels all magnetic interferences around the structure. Electronic shielding may also be accomplished by enclosing the entire structure in an inductor and applying the appropriate current and frequency patterns to create a magnetic shield. The use of such a field would increase the magnetic protection from outside, but would also provide a source of interference to the inside of the structure. This interference could be diminished through physical distance and added use of conventional metal shielding materials. Further, electronic shielding may be accomplished through the use of magnetized metal arranged in such a way as to provide flux line continuum around the entire structure. Again, metal shielding would probably be necessary to some extent around the interior of the enclosure.

We claim:

1. A magnetic and radio frequency-shielded room comprising, in combination:

an aluminum sheet placed upon the existing floor of the building in which the room is to be placed; an outer enclosure comprised of four walls, a ceiling, and a floor, each side of said enclosure being constructed of mumetal sheets abutted together, the seam formed by said abutting of said sheets being pressure sealed by application of a mumetal strip overlayed by an aluminum flat bar strip, both strips then being attached to said mumetal sheets by screw means screwed through mumetal sheets to underlying structural members;

a plurality of pneumatic isolators attached to the bottom of said outer enclosure raising said enclosure above said aluminum sheet;

an inner enclosure disposed within, and of less dimensions than, said outer enclosure, comprised of four walls, a ceiling, and a floor, each side of said enclosure being constructed of mumetal sheets abutted together, the seam formed by said abutting of said sheets being pressure sealed by application of mumetal strip overlayed by an aluminum flat bar strip, both strips then being attached to said mumetal sheets by screw means screwed through mumetal sheets to the underlying structural members;

a sheet of underlying structural material underlying said connected and sealed mumetal sheets of said outer enclosure and said connected and sealed mumetal sheets of said inner enclosure, said sheet of underlying structural material being screwed to said mumetal sheets;

an inner work floor comprised of layers of plywood overlayed by self adhesive tiling material;

a plurality of fiberglass dowels, the lower end of each being permanently affixed within an aluminum pipe stub permanently welded to said aluminum sheet, and the upper end of each said dowel being affixed within an aluminum pipe stub sunk into the bottom layer of said plywood of said inner floor, each dowel passing through said floor of said outer enclosure and said floor of said inner enclosure through holes drilled in said floor of said outer enclosure and through holes drilled in said floor of said inner enclosure, and through aluminum flat bar attached to and extending the length of the bottom surface of said inner floor, said holes being provided with magnetic wave guides and RF wave guides;

a crossed network of wooden beams disposed upon the upper surface of said floor of said outer enclosure separating said outer enclosure from said inner enclosure;

"I" beams welded to the upper surface of the ceiling of said inner enclosure;

a cable feed-through system comprised of a hooded plate disposed on said outer wall of said outer enclosure with honeycomb or rectangular cable feed through openings;

an enclosure vent system comprised of mumetal tube perforated mumetal plate, aluminum collar, and plastic flex hose connecting two vent subassemblies.

2. A shielded room as set forth in claim 1 in which said mumetal sheets are constructed of any type of metal with a permeability rating equaling or exceeding 100.

3. A shielded room as set forth in claim 1 in which said mumetal sheets of said outer enclosure and said inner enclosure are joined in a squared fashion.

4. A shielded room as set forth in claim 1 in which said mumetal sheets of said outer enclosure and said inner enclosure are staggered.

5. A shielded room as set forth in claim 1 in which the walls, ceiling and floor of said outer enclosure are joined by application of mumetal angle upon the joint, overlayed by aluminum angle, and a pressure seal applied followed by attachment of all layers by screw means, and the walls, ceiling and floor of said inner enclosure are joined by application of mumetal angle upon the joint, overlayed by aluminum angle, and a pressure seal applied followed by attachment of all layers by screw means.

6. A shielded room as set forth in claim 1 in which the outer corners of the inner mumetal layer and the outer corners of the outer mumetal layer have staggered joints, with cornerpieces welded prior to the annealing process applied to said mumetal sheets and said angle, said mumetal sheets and angles may be affixed in place using screws, rivets, adhesives, or bolts.

7. A shielded room as set forth in claim 1 in which said conductive sheet underlying said mumetal sheets is made of aluminum.

8. A shielded room as set forth in claim 1 in which said conductive sheet underlying said mumetal sheets is made of copper.

9. A shielded room as set forth in claim 1 in which said work floor is isolated from said floor of said inner enclosure by use of an insulating material.

10. A shielded room as set forth in claim 1 in which said mumetal sheets are comprised of multiple laminated layers of metal bonded together by a bonding agent, said laminated layers being placed one upon the other with edges flush.

11. A shielded room as set forth in claim 1 in which said mumetal sheets are comprised of multiple laminated layers of metal bonded together by a bonding agent, each said laminated layer being offset from the layer above or below, and said mumetal sheets thus configured being joined.

12. A magnetic and radio frequency-shielded room comprising, in combination:
- an aluminum sheet placed upon the existing floor of the building in which the room is to be placed;
- an outer enclosure comprised of four walls, a ceiling, and a floor, each side of said enclosure being constructed of mumetal mesh attached to an aluminum frame;
- a plurality of pneumatic isolators attached to the bottom of said outer enclosure raising said enclosure above said aluminum sheet;
- an inner enclosure disposed within, and of less dimensions than, said outer enclosure, comprised of four walls, a ceiling, and a floor, each side of said enclosure being constructed of mumetal mesh attached to an aluminum frame;
- an inner floor comprised of layers of plywood overlayed by self adhesive tiling material;
- a plurality of fiberglass dowels, the lower end of each being permanently affixed within an aluminum pipe stub permanently welded to said aluminum base, and the upper end of each said dowel being affixed within an aluminum pipe stub sunk into the bottom layer of said plywood of said work floor, each dowel passing through said floor of said outer enclosure and said floor of said inner enclosure through holes drilled in said floor of said outer enclosure and through holes drilled in said floor of said inner enclosure, and through an aluminum flat bar attached to and extending the length of the bottom surface of said work floor, said holes being provided with magnetic wave guides and RF wave guides; and
- a crossed network of wooden beams disposed upon the upper surface of said floor of said outer enclosure separating said outer enclosure from said inner enclosure.

* * * * *

UNITED STATES PATENT AND TRADEMARK OFFICE
CERTIFICATE OF CORRECTION

PATENT NO. : 4,959,504
DATED : September 25, 1990
INVENTOR(S) : Yarger et al.

It is certified that error appears in the above-identified patent and that said Letters Patent is hereby corrected as shown below:

In Col. 5, line 38, delete "174" and substitute therefor -- $\frac{1}{4}$ --.

In Col. 6, line 15, following "are" delete " $\frac{1}{4}$ with $\frac{1}{8}$ " and substitute therefor -- 1/4" with 1/8" --.

Signed and Sealed this

Twenty-first Day of April, 1992

Attest:

HARRY F. MANBECK, JR.

*Attesting Officer*     *Commissioner of Patents and Trademarks*